(12) United States Patent
Lee et al.

(10) Patent No.: US 12,156,435 B2
(45) Date of Patent: Nov. 26, 2024

(54) DISPLAY DEVICES AND METHODS OF MANUFACTURING DISPLAY DEVICES

(71) Applicant: SAMSUNG DISPLAY CO., LTD., Yongin-si (KR)

(72) Inventors: Sun-Youl Lee, Yongin-si (KR); Yeon-Heok You, Yongin-si (KR); Sang-Won Seo, Yongin-si (KR); Jung-Ju Yu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 317 days.

(21) Appl. No.: 17/706,103

(22) Filed: Mar. 28, 2022

(65) Prior Publication Data

US 2022/0216278 A1 Jul. 7, 2022

Related U.S. Application Data

(60) Continuation of application No. 15/663,546, filed on Jul. 28, 2017, now Pat. No. 11,289,553, which is a
(Continued)

(30) Foreign Application Priority Data

Sep. 30, 2013 (KR) ........................ 10-2013-0116436

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 50/8445* (2023.02); *H10K 59/124* (2023.02); *H10K 59/126* (2023.02); *H10K 59/131* (2023.02); *H10K 71/00* (2023.02); *H10K 59/1201* (2023.02)

(58) Field of Classification Search
CPC .... H10K 59/122; H10K 59/173; H10K 59/00; H10K 59/8722; H10K 50/8426
See application file for complete search history.

(56) References Cited

U.S. PATENT DOCUMENTS 6,642,651 B2  11/2003  Yudasaka
7,812,527 B2  10/2010  Kim et al.
(Continued)

FOREIGN PATENT DOCUMENTS

CN  1538364 A   10/2004
CN  101068025 A  11/2007
(Continued)

OTHER PUBLICATIONS

EPO Search Report dated Apr. 20, 2015, for corresponding European Patent application 14187179.8, (8 pages).

*Primary Examiner* — Amar Movva
(74) *Attorney, Agent, or Firm* — Lewis Roca Rothgerber Christie LLP

(57) ABSTRACT

A display device includes a substrate including a display region and a peripheral region, display structures at the display region of the substrate, a plurality of blocking structures at the peripheral region of the substrate wherein the blocking structures have heights different from each other, an organic layer on the display structures and the blocking structures, and an inorganic layer on the organic layer.

17 Claims, 8 Drawing Sheets

Related U.S. Application Data continuation of application No. 15/236,198, filed on Aug. 12, 2016, now abandoned, which is a division of application No. 14/498,984, filed on Sep. 26, 2014, now Pat. No. 9,450,034.

(51) Int. Cl.
*H10K 59/12* (2023.01)
*H10K 59/124* (2023.01)
*H10K 59/126* (2023.01)
*H10K 59/131* (2023.01)
*H10K 71/00* (2023.01)

(56) References Cited

U.S. PATENT DOCUMENTS

| | | |
|---|---|---|
| 7,902,755 B2 | 3/2011 | Kubota |
| 7,928,656 B2 | 4/2011 | Imamura |
| 8,264,143 B2 | 9/2012 | Bae et al. |
| 8,492,975 B2 | 7/2013 | Kim |
| 2002/0149320 A1 | 10/2002 | Maruyama et al. |
| 2003/0089991 A1 | 5/2003 | Yamazaki et al. |
| 2003/0117066 A1 | 6/2003 | Silvernail |
| 2003/0137325 A1 | 7/2003 | Yamazaki et al. |
| 2005/0046347 A1 | 3/2005 | Kato et al. |
| 2007/0046193 A1 | 3/2007 | Rhee et al. |
| 2007/0080377 A1 | 4/2007 | Sung et al. |
| 2007/0159089 A1 | 7/2007 | Oh et al. |
| 2007/0182314 A1 | 8/2007 | Oh et al. |
| 2009/0128020 A1 | 5/2009 | Takei et al. |
| 2009/0251048 A1 | 10/2009 | Choi et al. |
| 2009/0322657 A1 | 12/2009 | Na et al. |
| 2010/0258346 A1 | 10/2010 | Chen et al. |
| 2011/0006336 A1 | 1/2011 | Lee et al. |
| 2011/0140114 A1 | 6/2011 | Ko et al. |
| 2011/0221334 A1 | 9/2011 | Kwon et al. |
| 2012/0091477 A1 | 4/2012 | Kim |
| 2012/0242222 A1 | 9/2012 | Jung et al. |
| 2013/0037835 A1 | 2/2013 | Lee et al. |
| 2013/0063917 A1 | 3/2013 | Choi et al. |
| 2014/0138651 A1 | 5/2014 | Oh |

FOREIGN PATENT DOCUMENTS

| | | |
|---|---|---|
| CN | 101160001 A | 4/2008 |
| CN | 101221974 A | 7/2008 |
| CN | 101257096 A | 9/2008 |
| CN | 101477997 A | 7/2009 |
| CN | 102842594 A | 12/2012 |
| JP | 2004-047411 A | 2/2004 |
| KR | 10-2011-0067366 A | 6/2011 |
| KR | 10-2011-0128135 A | 11/2011 |
| KR | 10-2012-0127852 A | 11/2012 |

DISPLAY DEVICES AND METHODS OF MANUFACTURING DISPLAY DEVICES

CROSS REFERENCE TO RELATED APPLICATIONS

This application is a continuation of U.S. patent application Ser. No. 15/663,546, filed on Jul. 28, 2017, now U.S. Pat. No. 11,289,553, which is a continuation of U.S. patent application Ser. No. 15/236,198, filed on Aug. 12, 2016, which is a divisional application U.S. patent application Ser. No. 14/498,984, filed Sep. 26, 2014, now U.S. Pat. No. 9,450,034, which claims priority to and the benefit of Korean Patent Application No. 10-2013-0116436, filed Sep. 30, 2013, the entire content of all of which are incorporated herein by reference.

BACKGROUND

1. Field

Aspects of example embodiments of the invention are directed toward display devices and methods of manufacturing display devices.

2. Description of the Related Art

An organic light emitting display device employed in a flexible display device is usually susceptible to moisture and oxygen, so a sealing layer may be provided by alternately stacking organic films and inorganic films. However, in a comparative display device including an organic light emitting display device, the organic films formed utilizing monomers may leak into a peripheral region of pixels. In this case, moisture or oxygen may easily permeate or penetrate into the organic light emitting display device, such that the organic light emitting display may be undesirably deteriorated and also a lifespan and reliability of the display device may be reduced. Additionally, damage, such as cracks, may occur in the inorganic films. Such damage may propagate into internal elements of the display device through the organic films and other inorganic films, and thus the lifespan and reliability of the display device may be further reduced. Furthermore, underlying structures of the display device may be damaged because the underlying structures may be in contact with a mask for forming light emitting layers of the display device.

SUMMARY

Aspects of example embodiments of the invention are directed toward display devices including a plurality of blocking structures and methods of manufacturing display devices having a plurality of blocking structures.

Aspects of example embodiments are directed toward display devices including a plurality of blocking structures having different heights.

Aspects of example embodiments are directed toward methods of manufacturing display devices including a plurality of blocking structures having different heights.

According to one example embodiment, a display device includes a substrate including a display region and a peripheral region, a plurality of display structures at the display region of the substrate, a plurality of blocking structures at the peripheral region of the substrate, an organic layer on the display structures and the blocking structures, and an inorganic layer on the organic layer. The blocking structures having heights different from each other.

The plurality of blocking structures may include a plurality of blocking patterns. For example, each of the blocking structures may include a metal layer pattern and an insulation layer pattern.

The display device may additionally include wirings at the display region and the peripheral region of the substrate, an insulation layer covering the wirings, and a protection member on the insulation layer and on a portion of an outermost wiring of the wirings exposed by the insulation layer. Here, each of the display structures may include a first electrode on the insulation layer, a pixel defining layer on the insulation layer and partially exposing the first electrode, a spacer on the pixel defining layer, a light emitting layer on the exposed first electrode, and a second electrode on the pixel defining layer, the spacer, and the light emitting layer. The plurality of blocking structures may include a first blocking structure, a second blocking structure, and a third blocking structure. The first blocking structure may have a first height, and the second blocking structure may have a second height greater than the first height. Additionally, the third blocking structure may have a third height greater than the second height. The first blocking structure may include a first metal layer pattern and a first insulation layer pattern. The second blocking structure may include a second metal layer pattern, a second insulation layer pattern, and a third insulation layer pattern. The third blocking structure may include a third metal layer pattern, a fourth insulation layer pattern, a fifth insulation layer pattern, and a sixth insulation layer pattern. The first metal layer pattern may be a portion of the protection member, and the second metal layer pattern may be a portion of the outermost wiring. Further, the third metal layer pattern may include a same materials as that of the wirings. Each of the second insulation layer pattern and the fourth insulation layer pattern may include a same material as that of the insulation layer. Each of the first insulation layer pattern, the third insulation layer pattern, and the fifth insulation layer pattern may include a same material as that of the pixel defining layer. The sixth insulation layer pattern may include a same material as that of the spacer.

The display device may additionally include a fourth blocking structure adjacent to the third blocking structure and at the peripheral region. The fourth blocking structure may have a height substantially the same as a height of the third blocking structure. Here, the fourth blocking structure may include a fourth metal layer pattern, a seventh insulation layer pattern, an eighth insulation layer pattern, and a ninth insulation layer pattern. The fourth metal layer pattern may include a same material as that of the wirings, and the seventh insulation layer pattern may include a same material as that of the insulation layer. The eighth insulation layer pattern may include a same material as that of the pixel defining layer, and the ninth insulation layer pattern may include a same material as that of the spacer.

The display device may additionally include an additional blocking structure between adjacent pixels. The additional blocking structure may have a height substantially the same as a height of the third blocking structure. The additional blocking structure may include an additional metal layer pattern and a plurality of additional insulation layer patterns.

The plurality of blocking structures may include a first blocking structure on the outermost wiring and a second blocking structure adjacent to the first blocking structure. The first blocking structure may include a metal layer pattern that is a portion of the outermost wiring and two insulation layer patterns. Additionally, the second blocking structure may include a metal layer pattern and three insulation layer patterns.

The plurality of blocking structures may include a first blocking structure on the protection member and a second blocking structure on the outermost wiring. The first blocking structure may include a metal layer pattern that is a portion of the protection member and one insulation layer pattern. Further, the second blocking structure may include a metal layer pattern that is a portion of the outermost wiring and two insulation layer patterns.

According to another example embodiment, a method of manufacturing a display device includes providing a substrate including a display region and a peripheral region, forming a plurality of display structures at the display region of the substrate, forming a plurality of blocking structures having heights different from each other at the peripheral region of the substrate, and alternately forming an organic layer and an inorganic layer on the display structures and the blocking structures.

The method may further include forming transistors, an insulating interlayer, and wirings on the substrate, forming an insulation layer on the insulating interlayer to cover the transistors and the wirings, and forming a protection member at the peripheral region of the substrate to cover the insulation layer and an outermost wiring of the wirings.

The forming of the plurality of blocking structures may include forming a metal layer pattern adjacent to the outermost wiring, forming a first insulation layer pattern on a portion of the outermost wiring, and forming a second insulation layer pattern on the metal layer pattern.

The outermost wiring and the metal layer pattern may be concurrently formed. Further, the first and the second insulation layer patterns and the insulation layer may be concurrently formed.

The forming of the plurality of display structures may include forming first electrodes on the insulation layer, forming a pixel defining layer and a spacer on the insulation layer, the pixel defining layer partially exposing the first electrodes, forming light emitting layers on each of the exposed first electrodes, and forming a second electrode on the light emitting layers, the pixel defining layer, and the spacer.

The forming of the plurality of blocking structures may further include forming a third insulation layer pattern on the protection member, forming a fourth insulation layer pattern on the first insulation layer pattern, forming a fifth insulation layer pattern on the second insulation layer pattern, and forming a sixth insulation layer pattern on the fifth insulation layer pattern. The third insulation layer pattern, the fourth insulation layer pattern, and the fifth insulation layer pattern may be concurrently formed with the pixel defining layer. Further, the sixth insulation layer pattern and the spacer may be concurrently formed.

According to aspects of example embodiments, the display device may include a plurality of blocking structures having heights different from each other so that the leakage or overflow of organic layers, which are formed by treating monomers, from the display region into the peripheral region may be effectively prevented. Further, failures or damage, such as cracks, generated in the inorganic layers may be prevented from propagating toward the display region. Therefore, the display device may exhibit enhanced durability, reliability, structural stability, etc. Furthermore, the blocking structures may efficiently protect the underlying structures in the display region during the formation of the light emitting layers, such that the display device may have improved durability, reliability, structural stability, etc.

BRIEF DESCRIPTION OF THE DRAWINGS

Example embodiments may be understood in more detail from the following description taken in conjunction with the accompanying drawings, in which.

DETAILED DESCRIPTION

Figure 1:
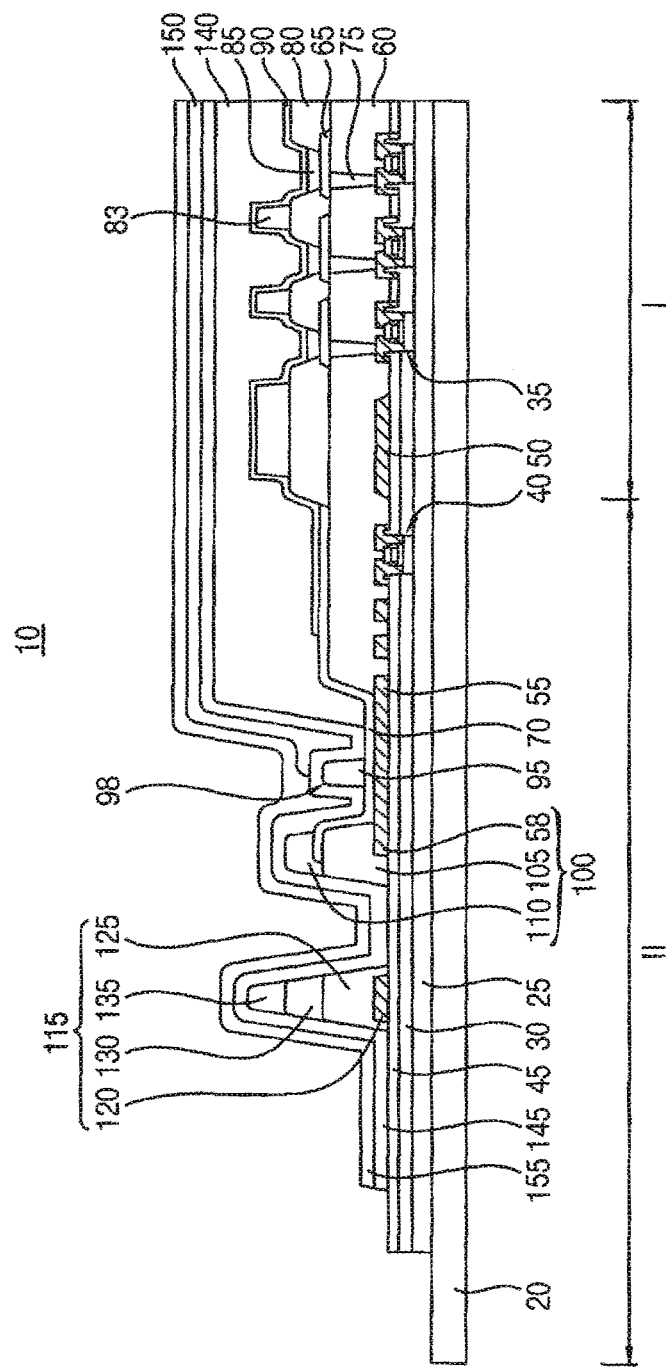
FIG. 1 is a cross-sectional view illustrating a display device in accordance with an example embodiment.

The example embodiments are described more fully hereinafter with reference to the accompanying drawings. The invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to", or "coupled to" another element or layer, it can be directly on, connected, or coupled to the other element or layer, or intervening elements or layers may be present. When an element is referred to as being "directly on," "directly connected to", or "directly coupled to" another element or layer, there are no intervening elements or layers present. Like or similar reference numerals refer to like or similar elements throughout. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, components, regions, layers, patterns, and/or sections, these elements, components, regions, layers, patterns and/or sections should not be limited by these terms. These terms are only used to distinguish one element, component, region, layer, pattern, or section from another element, component, region, layer, pattern, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "under" other elements or features would then be oriented "above" or "over" the other elements or features. Thus, the example term "below" may encompass both an orientation of over and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, the use of "may" when describing embodiments of the present invention refers to "one or more embodiments of the present invention."

Example embodiments are described herein with reference to cross sectional illustrations that are schematic illustrations of illustratively idealized example embodiments (and intermediate structures) of the invention. As such, variations from the shapes of the illustrations as a result of, for example, manufacturing techniques and/or tolerances, are to be expected. Thus, the example embodiments should not be construed as limited to the particular shapes of regions illustrated herein but are to include deviations in shapes that result from, for example, manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a display device in accordance with an example embodiment.

Referring to FIG. 1, a display device 10 according to the example embodiment may include a substrate 20, a peripheral circuit, display structures, and a plurality of blocking structures. In example embodiments, the display device 10 may include a display region I (e.g., an active region) and a peripheral region II substantially surrounding the display region I.

In example embodiments, each of the display structures may include a first electrode 65, a light emitting layer 85, and a second electrode 90. The plurality of blocking structures may have different heights (e.g., substantially different heights). The plurality of blocking structures may include a first blocking structure 98, a second blocking structure 100, and a third blocking structure 115. At least one of the first to the third blocking structures 98, 100, and 115 may include a plurality of blocking patterns. Arrangements of the first to the third blocking structures 98, 100, and 115 will be described in detail. In the display device 10 illustrated in FIG. 1, the first blocking structure 98 may have a first height, and the second blocking structure 100 may have a second height substantially greater than the first height. Further, the third blocking structure 115 may have a third height substantially greater than the second height. For example, the plurality of blocking structures of the display device 10 may have different heights increasing further away from the display region I of the display device 10 (that is, the height of the blocking structures closer to an outside of the peripheral region II of the display device 10 may be greater than the height of the blocking structures closer to the display region I of the display device 10).

The display structures may be disposed in the display region I of the display device 10 while the peripheral circuit and the first to the third blocking structures 98, 100 and 115 may be positioned in the peripheral region II of the display device 10. In example embodiments, the peripheral region II of the display device 10 may comprise a peripheral circuit region where the peripheral circuit is located and a dead space region (e.g., a region may not contribute to display of images) corresponding to an outermost region of the pixel. Here, the plurality of blocking structures may be disposed in the peripheral circuit region and the dead space region. For example, the first blocking structure 98 and the second blocking structure 100 may be disposed in the peripheral circuit region, and the third blocking structure 115 may be located in the dead space region.

In the display device 10 illustrated in FIG. 1, the substrate 20 may include a flexible transparent resin. For example, the substrate 20 may include a poly(methyl methacrylate)-based resin (PMMA), a polyimide-based resin, an acryl-based resin, a polyacrylate-based resin, a polycarbonate-based resin, a polyether-based resin, a sulfonic acid-based resin, a polyethylene terephthalate-based resin (PET), etc. In some example embodiments, the substrate 20 may include a transparent ceramic substrate, for example, a thin glass substrate.

A buffer layer 25 may be disposed on the substrate 20. The buffer layer 25 may allow the display structures and the plurality of blocking structures to be easily formed on the substrate 20. Additionally, the buffer layer 25 may prevent diffusion of the materials from the substrate 20. Furthermore, the buffer layer 25 may prevent the permeation of moisture and/or oxygen from an outside into the display device 10. The buffer layer 25 may substantially improve a flatness of the substrate 20 (that is, the buffer layer 25 may provide a substantially flat surface above the substrate 20).

In example embodiments, the buffer layer 25 may have an area (e.g., a surface area) substantially smaller than that of the substrate 20. For example, the buffer layer 25 may expose a portion of the substrate 20 adjacent to an edge of the substrate 20. Thus, a step may be generated between the substrate 20 and the buffer layer 25. The buffer layer 25 may include a silicon compound, a transparent resin, etc. For example, the buffer layer 25 may include at least one buffer film containing silicon oxide (e.g., $SiO_2$), silicon nitride (e.g., $Si_3N_4$), silicon oxycarbide, silicon carbon nitride, a polyacrylate-based resin, a poly(methyl acrylate)-based resin (PMA), an olefin-based resin, and/or a polyvinyl-based resin. In example embodiments, the buffer layer 25 may include two buffer films containing different silicon compounds, respectively. In some example embodiments, the buffer layer 25 may have a stacked structure in which at least one buffer film composed of a silicon compound and at least one buffer film composed of a transparent resin are alternately formed on the substrate 20. However, the structure of the buffer layer 25 may vary in accordance with configuration, dimension, and/or use of the display device 10.

A gate insulation layer 30 may be disposed on the buffer layer 25. In example embodiments, the gate insulation layer 30 may have an area (e.g., a surface area) substantially the same as or substantially similar to that of the buffer layer 25. The gate insulation layer 30 may cover the active patterns of the first and the second transistors 35 and 40 on the buffer layer 25. For example, the active patterns may include a silicon compound, a semiconductor oxide, etc. In case that the active patterns include low temperature polysilicon (LTPS), the active patterns may be obtained by a crystallization process. The gate insulation layer 30 may include a silicon compound such as silicon oxide, silicon nitride, etc. Alternatively, the gate insulation layer 30 may include a metal oxide.

Gate electrodes of the first and the second transistors 35 and 40 may be disposed on portions of the gate insulation layer 30 covering the active patterns. Each of the gate electrodes may include a metal, an alloy, a conductive metal oxide, a transparent conductive material, etc. Wirings, such as gate lines electrically coupled to (e.g., electrically connected to) the gate electrodes may be disposed on the gate insulation layer 30.

An insulating interlayer 45 may be formed on the gate insulation layer 30 to cover the gate electrodes of the first and the second transistors 35 and 40. The insulating interlayer 45 may electrically insulate the gate electrodes of the first and the second transistors 35 and 40 from upperlying wirings and/or electrodes. The insulating interlayer 45 may include a silicon compound, a transparent resin, etc. Examples of the silicon compound for the insulating interlayer 45 may include silicon oxide, silicon nitride, silicon oxynitride, etc.

Source electrodes and drain electrodes of the first and the second transistors 35 and 40 may be disposed on the insulating interlayer 45. Additionally, wirings including data lines 50 and an outermost wiring 55 (e.g., power lines) may be positioned on the insulating interlayer 45. The data lines 50 may be electrically coupled to (e.g., electrically connected to) the source electrodes of the first and the second transistors 35 and 40. The outermost wiring 55 may be electrically coupled to the second electrode 90 of the display structure. Each of the source electrodes and the drain electrodes may include a metal, an alloy, a conductive metal oxide, a transparent conductive material, etc. The source electrodes and the drain electrodes may pass through the insulating interlayer 45 and contact the active patterns, respectively.

As illustrated in FIG. 1, an insulation layer 60 may be disposed to cover the first transistors 35 and the data lines 50 in the display region I. The insulation layer 60 may extend into the peripheral region II so that the insulation layer 60 may cover the second transistor 40 and partially cover an outermost wiring 55 in the peripheral region II. The insulation layer 60 may electrically insulate the first transistors 35 from the first electrodes 65 of the display structures in the display region I.

The insulation layer 60 may include organic material. For example, the insulation layer 60 may include a polyimide-based resin, a photoresist, an acryl-based resin, a polyimide-based resin, etc. These may be used alone or in a combination thereof. The insulation layer 60 may have a single layer structure or a multi layer structure. In some example embodiments, the insulation layer 60 may include inorganic material such as a silicon compound, a metal oxide, etc. Examples of the silicon compound for the insulation layer 60 may include silicon oxide, silicon nitride, silicon oxynitride, etc.

The peripheral circuit covered by the insulation layer 60 may include a gate driver, a data driver, a timing controller, etc., in addition to the second transistor 40 and the wirings including the outermost wiring 55.

The first electrodes 65 may be disposed on the insulation layer 60. The first electrodes 65 may be electrically coupled to (e.g., electrically connected to) the drain electrodes of the first transistors 35 through contacts 75 formed in the insulation layer 60, respectively. In the display region I, adjacent first electrodes 65 may be spaced apart by a distance (e.g., a predetermined distance). Each of the first electrodes 65 may include a metal, an alloy, a metal nitride, a conductive metal oxide, a transparent conductive material, etc. These may be used alone or in a combination thereof.

In the display region I of the display device 10 illustrated in FIG. 1, a pixel defining layer 80 may be disposed on the insulation layer 60. The pixel defining layer 80 may have openings exposing the first electrodes 65, respectively. The openings of the pixel defining layer 80 may define respective light emitting regions of the display device 10. The pixel defining layer 80 may extend onto a portion of the insulation layer 60 which covers the wirings 50 in the display region I. The pixel defining layer 80 may include organic material. For example, the pixel defining layer 80 may include a polyimide-based resin, a photoresist, a polyacryl-based resin, a polyamide-based resin, an acryl-based resin, etc. A spacer 83 may be disposed on the pixel defining layer 80 so as to ensure a cell gap of the pixel. In example embodiments, the spacer 83 may include material substantially the same as or substantially similar to that of the pixel defining layer 80. In this case, the spacer 83 and the pixel defining layer 80 may be formed by (e.g., obtained by) an etching process utilizing a halftone mask, a halftone slit mask, etc. Here, the spacer 83 may be intergrally formed with the pixel defining layer 80. In some example embodiments, the spacer 83 may be separately formed on the pixel defining layer 80. For example, the spacer 83 may be additionally formed on the pixel defining layer 80.

In the peripheral region II of the display device 10, a protection member 70 may be disposed on the upper portion and a lateral portion (e.g., a side) of the insulation layer 60. The protection member 70 may protect the peripheral circuit from static electricity, external impact, etc. Further, the protection member 70 may serve as a wiring for electrically coupling the outermost wiring 55 to the second electrode 90. In example embodiments, the protection member 70 may extend onto the outermost wiring 55 from a side of the pixel defining layer 80 in the peripheral region II. For example, the protection member 70 may contact the side of the pixel defining layer 80 and may extend onto the outermost wiring 55 while substantially enclosing the side of the pixel defining layer 80.

The protection member 70 may include material substantially the same as or substantially similar to those of the first electrodes 65. For example, the protection member 70 may include a metal, an alloy, a metal nitride, a conductive metal oxide, a transparent conductive material, etc. The protection member 70 may have a single layer structure or a multi layer structure containing the above-described metal, alloy, metal nitride, conductive metal oxide, and/or transparent conductive material. As further described below, a portion of the protection member 70 may serve as a first metal layer pattern of the first blocking structure 98. For example, the first blocking structure 98 may include the first metal layer pattern, which is the portion of the protection member 70, and a first insulation layer pattern 95.

Light emitting layers 85 may be disposed respectively on the first electrodes 65 exposed by the openings in the pixel defining layer 80. Each of the light emitting layers 85 may have a multi layer structure that includes an organic light emitting layer (EML), a hole injection layer (HIL), a hole transfer layer (HTL), an electron transfer layer (ETL), an electron injection layer (EIL), etc. The organic light emitting layers of the light emitting layers 85 may include light emitting materials emitting different colors of light, such as red, blue, and green, according to the respective kind of pixel. In some example embodiments, the organic light emitting layer of each light emitting layer 85 may include a plurality of stacked light emitting materials for emitting red light, blue light, and green light so as to generate substantially white color light.

The second electrode 90 may be disposed on the light emitting layers 85, the pixel defining layer 80, and the spacer 83. The second electrode 90 may extend onto the protection member 70 in the peripheral region II. For example, the second electrode 90 may overlap the protection member 70 in the peripheral region II. The second electrode 90 may serve as a common electrode shared by adjacent pixels of the display device 10. The second electrode 90 may include a metal, an alloy, a metal nitride, a conductive metal oxide, a transparent conductive material, etc.

As illustrated in FIG. 1, the first to the third blocking structures 98, 100, and 115 including the plurality of blocking patterns may be positioned in the peripheral region II of the display device 10.

In example embodiments, the first blocking structure 98 having the first height may be disposed on the outermost wiring 55. The first blocking structure 98 may include the first metal layer pattern and the first insulation layer pattern 95. Because the first blocking structure 98 may have the first metal layer pattern and the first insulation layer pattern 95, the first blocking structure 98 may prevent a first organic layer 140 and/or a second organic layer 150 of the display device 10 from leaking to an outside of the peripheral region II (e.g., the first blocking structure 98 may prevent the first organic layer 140 and/or a second organic layer 150 from contacting the outermost wiring 55). In example embodiments, the first metal layer pattern may be a portion of the protection member 70, and the first insulation layer pattern 95 may be positioned on the first metal layer pattern. The first insulation layer pattern 95 may be easily formed when the first insulation layer pattern 95 is formed on the first metal layer pattern. In the display device 10 illustrated in FIG. 1, the first organic layer 140 may be spaced from (e.g., spaced apart from) the first blocking structure 98, however, the first organic layer 140 may contact the first blocking structure 98 so as to prevent the leakage of the first organic layer 140 toward the outside of the peripheral region II of the display device 10. Hence, the first blocking structure 98 may effectively prevent the leakage of the first organic layer 140 even though the first organic layer 140 has a relatively large thickness.

The first blocking structure 98 may have the first height that may be substantially greater than that of the insulation layer 60 in the display region I by the sum of thicknesses of the outermost wiring 55 and the protection member 70. In some example embodiments, the first metal layer pattern of the first blocking structure 98 may be a portion of the outermost wiring 55 when the display device 10 does not include the protection member 70. In this case, the first height of the first blocking structure 98 may be substantially greater than that of the insulation layer 60 by the thickness of the outermost wiring 55. The first insulation layer pattern 95 may include material substantially the same as or substantially similar to that of a pixel defining layer 80 in the display region I. For example, the first insulation layer pattern 95 may include a polyimide-based resin, a photoresist, an acryl-based resin, a polyamide-based resin, a siloxane-based resin, etc. These may be used alone or in a combination thereof.

The second blocking structure 100 may be adjacent to the first blocking structure 98. The second blocking structure 100 may include a second metal layer pattern 58, a second insulation layer pattern 105, and a third insulation layer pattern 110. The second blocking structure 100 may further prevent the first organic layer 140 and/or the second organic layer 150 from leaking into the peripheral region II. For example, when the second organic layer 150 flows over the first blocking structure 98, the second blocking structure 100 may prevent the leakage of the second organic layer 150 toward the peripheral region II (e.g., the second blocking structure 100 may prevent further leakage of the second organic layer 150 into the peripheral region II). The second height of the second blocking structure 100 may be substantially greater than the first height of the first blocking structure 98 by a thickness of the third insulation layer pattern 110.

In example embodiments, the second metal layer pattern 58 of the second blocking structure 100 may be an end portion of the outermost wiring 55. The second insulation layer pattern 105 may be disposed (e.g., partially disposed) on the insulating interlayer 45 to cover the second metal layer pattern 58. For example, one end portion of the outermost wiring 55 may be covered by the second insulation layer pattern 105, and a top portion (e.g., a central portion) of the outermost wiring 55 may be covered by the first insulation layer pattern 95. Additionally, another end portion of the outermost wiring 55 may be covered by the insulation layer 60. Here, the protection member 70 may extend onto a side of the second insulation layer pattern 105 and onto a portion of an upper face (e.g., a portion of a top) of the second insulation layer pattern 105. Thus, one end portion of the protection member 70 may be interposed between the second insulation layer pattern 105 and the third insulation layer pattern 110. The second insulation layer pattern 105 may be easily formed when the second insulation layer pattern 105 is disposed on the second metal layer pattern 58. The second insulation layer pattern 105 may include a material substantially the same as or substantially similar to that of the insulation layer 60 in the display region I. In example embodiments, the second insulation layer pattern 105 and the insulation layer 60 may be formed in (e.g., obtained by) one process (e.g., a single process). For example, the second insulation layer pattern 105 may include a polyimide-based resin, a photoresist, an acryl-based resin, a polyamide-based resin, etc. These may be used alone or in a combination thereof. In some example embodiments, the second insulation layer pattern 105 may include inorganic material, for example, a silicon compound, a metal oxide, etc. The third insulation layer pattern 110 may include material substantially the same as or substantially similar to that of the pixel defining layer 80 in the display region I. For example, the third insulation layer pattern 110 may include a polyimide-based resin, a photoresist, an acryl-based resin, a polyamide-based resin, etc. These may be used alone or in a combination thereof. In this case, the third insulation layer pattern 110 and the pixel defining layer 80 may be formed in (e.g., obtained by) the same process (e.g., a single process).

In the display device 10 illustrated in FIG. 1, the third blocking structure 115 may be arranged adjacent to the second blocking structure 100. In example embodiments, the first and the second blocking structures 98 and 100 may be arranged in the peripheral circuit region of the peripheral region II, and the third blocking structure 115 may be disposed in the dead space region of the peripheral region II. The third blocking structure 115 may prevent damage to other structures (e.g., underlying structures) including the second blocking structure 100 and the pixel defining layer 80 during a process of positioning a mask on the pixel defining layer 80 and/or the spacer 83 in order to form the light emitting layers 85 in the display region I. Further, the third blocking structure 115 may prevent failures such as cracks generated in a first inorganic layer 145 and/or a second inorganic layer 155 from propagating into structures in the display region I from the peripheral region II. Furthermore, the third blocking structure 115 may prevent the leakage of the second organic layer 150 toward the peripheral region II (e.g., may prevent the leakage of the second organic layer 150 further into the peripheral region II). In some example embodiments, when the display device 10 includes additional organic and inorganic layers, the third blocking structure 115 may prevent the additional organic layers from flowing into (e.g., flowing further into) the peripheral region II.

In example embodiments, the third blocking structure 115 may include a third metal layer pattern 120, a fourth insulation layer pattern 125, a fifth insulation layer pattern 130, and a sixth insulation layer pattern 135. The third height of the third blocking structure 115 may be substantially greater than the second height of the second blocking structure 100. For example, the third height of the third blocking structure 115 may be greater than the second height of the second blocking structure 100 by a thickness of the sixth insulation layer pattern 135. Accordingly, the display device 10 may include the first to the third blocking structures 98, 100, and 115 having heights increased toward an outside of the pixel (e.g., the respective heights of the first to the third blocking structures 98, 100, and 115 may increase according to a distance from an outside of the display device 10).

The third metal layer pattern 120 may include material substantially the same as or substantially similar to that of the wirings 50 and 55. The fourth insulation layer pattern 125 may be easily formed when the fourth insulation layer pattern 125 is disposed on the third metal layer pattern 120. In example embodiments, the third metal layer pattern 120 may include a metal, an alloy, a metal nitride, a conductive metal oxide, a transparent conductive material, etc. For example, the third metal layer pattern 120 may include aluminum, an alloy containing aluminum, aluminum nitride, silver, an alloy containing silver, tungsten, tungsten nitride, copper, an alloy containing copper, nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. The third metal layer pattern 120 and the wirings 50 and 55 may be formed in (e.g., obtained by) the same process (e.g., a single process). For example, the first metal layer pattern (i.e., the portion of the protection member 70), the second metal layer pattern 58, and the third metal layer pattern 120 may be concurrently or simultaneously formed.

The fourth insulation layer pattern 125 of the third blocking structure 115 may include material substantially the same as or substantially similar to that of the insulation layer 60 in the display region I. For example, the fourth insulation layer pattern 125 may include material substantially the same as those of the first insulation layer pattern 95 and the second insulation layer pattern 105. In example embodiments, the insulation layer 60 and the first insulation layer pattern 95 may be formed in (i.e, may be obtained by) the same process (i.e, a single process). In some example embodiments, the first insulation layer pattern 95, the second insulation layer pattern 105 and the fourth insulation layer pattern 125 may be formed in the same process. In further example embodiments, the insulation layer 60, the first insulation layer pattern 95, the second insulation layer pattern 105 and the fourth insulation layer pattern 125 may be formed in the same process. The fifth insulation layer pattern 130 may include material substantially the same as or substantially similar to that of the pixel defining layer 80 in the display region I. For example, the fifth insulation layer pattern 130 and the pixel defining layer 80 may be concurrently or simultaneously formed (e.g., obtained). The sixth insulation layer pattern 135 may include material substantially the same as or substantially similar to that of the spacer 83 in the display region I. In example embodiments, the fifth insulation layer pattern 130 and the sixth insulation layer pattern 135 may be formed in (e.g., obtained in) the process for forming the pixel defining layer 80 and the spacer 83 in the display region I.

As described above, the display device 10 according to example embodiments may include at least one blocking structure that may have at least one metal layer patterns and at least one insulation layer pattern. The first to the third blocking structures 98, 100, and 115 may have various kinds of blocking patterns and the numbers of the blocking patterns in the first to the third blocking structures 98, 100, and 115 may be different or may vary, such that the first to the third blocking structures 98, 100, and 115 may have different or various heights, respectively.

Referring now to FIG. 1, the first organic layer 140 may be formed in the display region I and in the peripheral region II to cover the display structures. Although it is not illustrated in FIG. 1, the first organic layer 140 may flow over the first blocking structure 98 and may contact the second blocking structure 100 in the peripheral region II. Furthermore, the first organic layer 140 may flow over the first and the second blocking structures 98 and 100, and may make contact with the third blocking structure 115 in the peripheral region II. That is, the first organic layer 140 may be formed on the first blocking structure 98 and/or the second blocking structure 100, and may be contacted with the third blocking structure 115. The first organic layer 140 may improve the flatness of the display device 10 and also may protect the display structures in the display region I. Further, the first organic layer 140 may prevent the diffusion of impurities from or to the underlying structures. For example, the first organic layer 140 may include a polyimide-based resin, a polyacryl-based resin, a polyamide-based resin, etc.

A first inorganic layer 145 may be disposed on the first organic layer 140. The first inorganic layer 145 may prevent the first organic layer 140 and the display structures from being deteriorated by the permeation of moisture, oxygen, etc. Additionally, the first inorganic layer 145 may protect the first organic layer 140 and the display structures from external impacts. The first inorganic layer 145 may include a metal compound. For example, the first inorganic layer 145 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, etc.

The second organic layer 150 may be positioned on the first inorganic layer 145. The second organic layer 150 may perform functions substantially the same as or substantially similar to those of the first organic layer 140, and the second organic layer 150 may include material substantially the same as or substantially similar to that of the first organic layer 140.

A second inorganic layer 155 may be disposed on the second organic layer 150. The second inorganic layer 155 may perform functions substantially the same as or substantially similar to those of the first inorganic layer 145, and the second inorganic layer 155 may include material substantially the same as or substantially similar to that of the first inorganic layer 145.

According to example embodiments, the display device 10 may include the first to the third blocking structures 98, 100, and 115 having the above-described configurations, so the leakage or overflow of the first and the second organic layers 140 and 150 formed by the processing of monomers may be effectively prevented. For example, the first and the second organic layers 140 and 150 may flow over the first blocking structure 98 and may contact the second blocking structure 100 in the peripheral region II. Further, the first organic layer 140 may flow over the first and the second blocking structures 98 and 100, and may make contact with the third blocking structure 115 in the peripheral region II. In other words, the first and the second organic layers 140 and 150 may not flow toward the outside of the peripheral region II because of the first blocking structure 98, the second blocking structure 100 and/or the third blocking structure 115 (e.g., the first and the second organic layers 140 and 150 may not flow further into the peripheral region II past the first blocking structure 98, the second blocking structure 100 and/or the third blocking structure 115). Further, the durability and the reliability of t the display device 10 may not be degraded because the first to the third blocking structures 98, 100, and 115 may block the propagation of failures such as cracks that may be generated in the first inorganic layer 145 and/or the second inorganic layer 155. Furthermore, the first to the third blocking structures 98, 100 and 115 may effectively protect the underlying structures, such as the display structures, during the masking process for forming the light emitting layers 85 in the display region I, so that the display device 10 may have improved reliability, durability, etc.

In some example embodiments, the display device 10 may include at least one additional upper organic layer and at least one additional upper inorganic layer according to application, dimensions, components, etc. Alternatively, the display device 10 may include at least one additional lower organic layer and at least one additional lower inorganic layer. When a plurality of additional organic layers are disposed in the display device 10, the second blocking structure 100 and/or the third blocking structure 115 may effectively prevent the leakage or overflow of the additional organic layers from the display region I to the peripheral region II. In further example embodiments, the display device 10 may include one organic layer and one inorganic layer.

Figure 2:
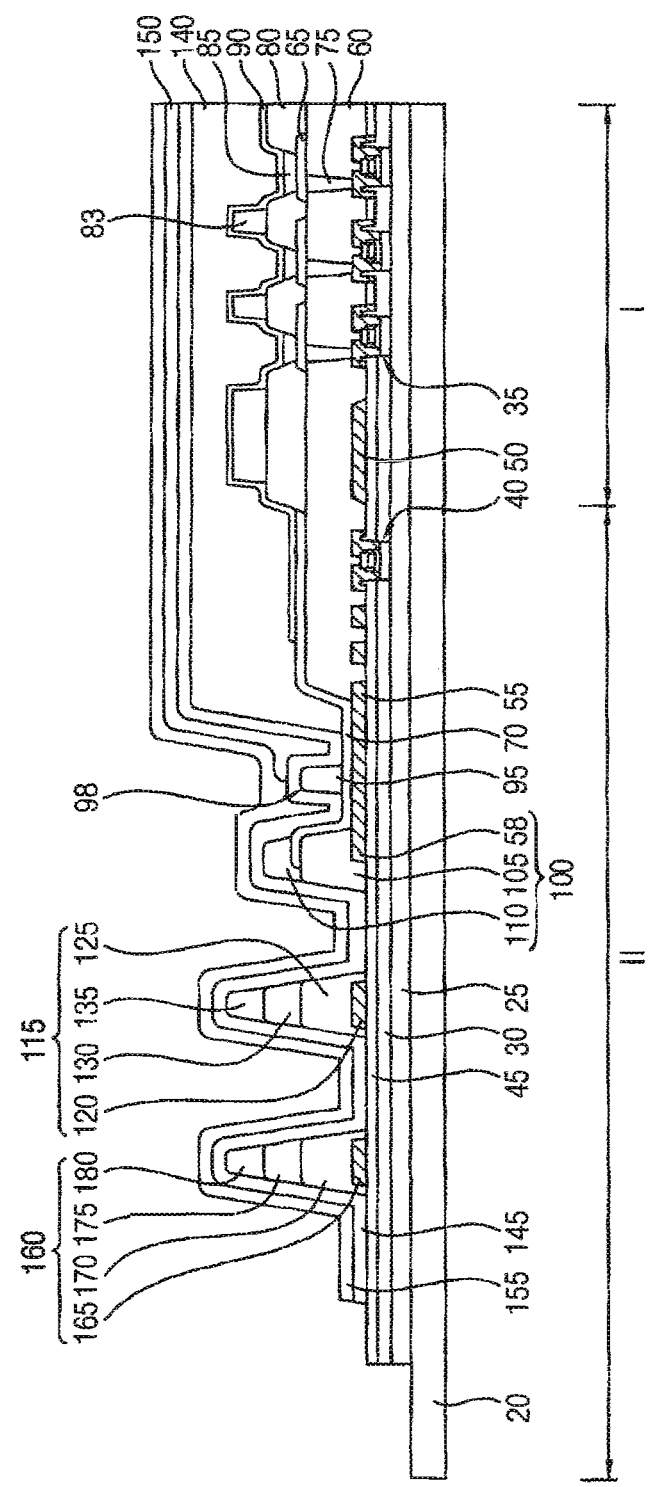
FIG. 2 is a cross-sectional view illustrating a display device in accordance with another example embodiment.

FIG. 2 is a cross-sectional view illustrating a display device in accordance with some other example embodiments of the invention. In FIG. 2, like reference numerals are used to designate elements of the display device the same as those in FIG. 1, and detailed description of these elements may be omitted. The display device illustrated in FIG. 2 may have a configuration substantially the same as or substantially similar to that of the display device 10 described with reference to FIG. 1 except for a fourth blocking structure 160 adjacent to the third blocking structure 115.

Referring to FIG. 2, the fourth blocking structure 160 may have a fourth height substantially the same as or substantially similar to the third height of the third blocking structure 115. Further, the fourth blocking structure 160 may include blocking patterns substantially the same as or substantially similar to those of the third blocking structure 115. That is, the display device may include two blocking structures 115 and 160 located adjacent to the first and the second blocking structures 98 and 100 disposed in the peripheral region II (e.g., the two blocking structures 115 and 160 may be adjacent to the peripheral circuit region and in the dead space region). Here, the fourth blocking structure 160 may have a configuration substantially the same as or substantially similar to that of the third blocking structure 115.

The fourth blocking structure 160 may include a fourth metal layer pattern 165, a seventh insulation layer pattern 170, an eighth insulation layer pattern 175, and a ninth insulation layer pattern 180. The fourth metal layer pattern 165 may include material substantially the same as or substantially similar to that of the third metal layer pattern 120. In addition, the seventh to the ninth insulation layer patterns 170, 175, and 180 may include materials substantially the same as or substantially similar to those of the fourth to the sixth insulation layer patterns 125, 130, and 135, respectively.

Because the display device may additionally include the fourth blocking structure 160, the leakage or overflow of the first organic layer 140, the second organic layer 150, and/or additional organic layers toward the peripheral region II may be efficiently prevented. Further, the progression of failures such as cracks generated in the first inorganic layer 145, the second inorganic layer 155, and/or additional inorganic layers may be blocked. Furthermore, the first to the fourth blocking structures 98, 100, 115, and 160 may effectively protect the underlying structures, including the display structures in the display region I, during the process for forming the light emitting layers 85. As a result, the display device may ensure enhanced durability, reliability, etc.

Figure 3:
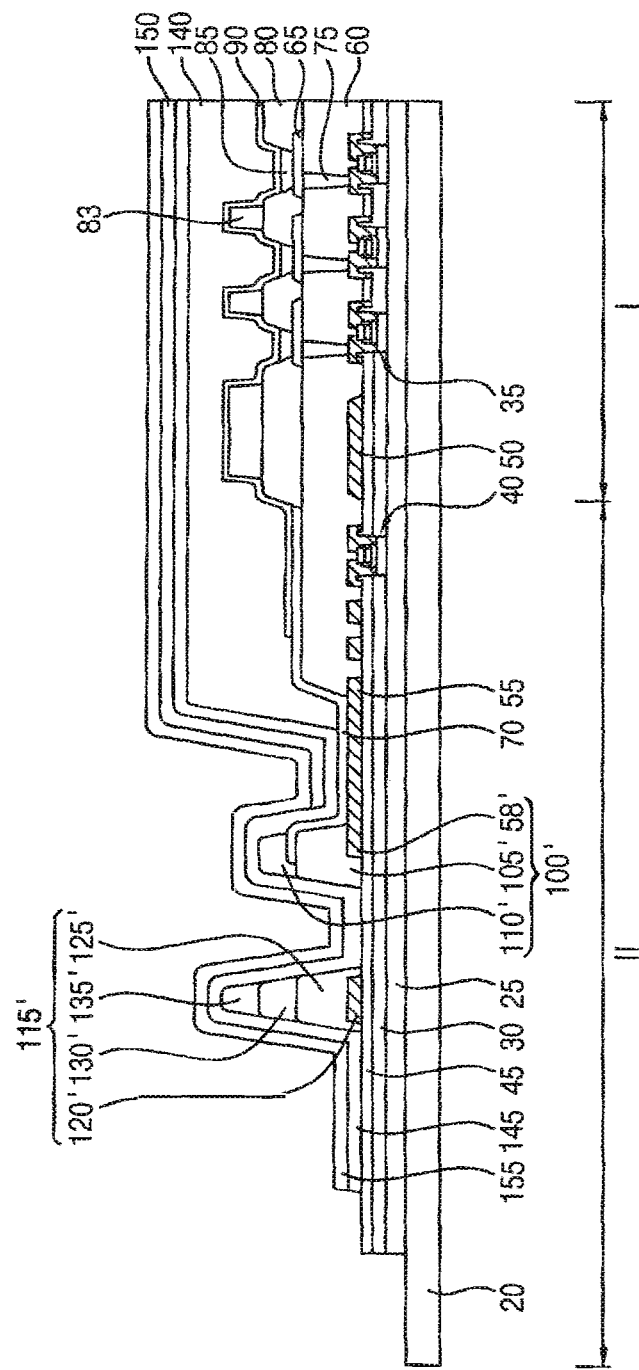
FIG. 3 is a cross-sectional view illustrating a display device in accordance with yet another example embodiment.

FIG. 3 is a cross-sectional view illustrating a display device in accordance with some other example embodiments of the invention. In the display device illustrated in FIG. 3, a first blocking structure 100' and a second blocking structure 115' may have configurations substantially the same as or substantially similar to those of the second blocking structure 100 and the third blocking structure 115 described with reference to FIG. 1. That is, the second blocking structure 100 and the third blocking structure 115 in FIG. 1 may substantially correspond to or may be substantially similar to the first blocking structure 100' and the second blocking structure 115' in FIG. 3. The display device illustrated in FIG. 3 may have a configuration substantially the same as or substantially similar to that of the display device 10 described with reference to FIG. 1 except for the first blocking structure 98 illustrated in FIG. 1. Namely, a blocking structure may not be disposed on the protection member 70.

In some example embodiments, the first blocking structure 100' may include a first metal layer pattern 58', a first insulation layer pattern 105', and a second insulation layer pattern 110'. In this case, the first metal layer pattern 58', the first insulation layer pattern 105', and the second insulation layer pattern 110' may be substantially the same as or substantially similar to the second metal layer pattern 58, the second insulation layer pattern 105, and the third insulation layer pattern 110, respectively. The second blocking structure 115' may include a second metal layer pattern 120', a third insulation layer pattern 125', a fourth insulation layer pattern 130', and a fifth insulation layer pattern 135'. Here, the second metal layer pattern 120', the third insulation layer pattern 125', the fourth insulation layer pattern 130', and the fifth insulation layer pattern 135' may be substantially the same as or substantially similar to the third metal layer pattern 120, the fourth insulation layer pattern 125, the fifth insulation layer pattern 130, and the sixth insulation layer pattern 135, respectively.

According to some example embodiments, the display device may include two blocking structures 100' and 115' having different heights, so that the leakage or the overflow of the first organic layer 140 and/or the second organic layer 150 toward the peripheral region II may be prevented when the display device does not include additional organic layers. Additionally, the second blocking structure 115' may prevent damage to the underlying structures while forming the light emitting layers 85 utilizing a mask. Furthermore, the first and the second blocking structures 100' and 115' may prevent the progression of cracks that may generated in the first inorganic layer 145 and the second inorganic layer 155 toward the underlying structures in the display region I. Because the display device illustrated in FIG. 3 may include the two blocking structures 100' and 115', the display device may have relatively small dimensions (e.g., smaller dimensions than the display devices illustrated in FIGS. 1 and 2).

Figure 4:
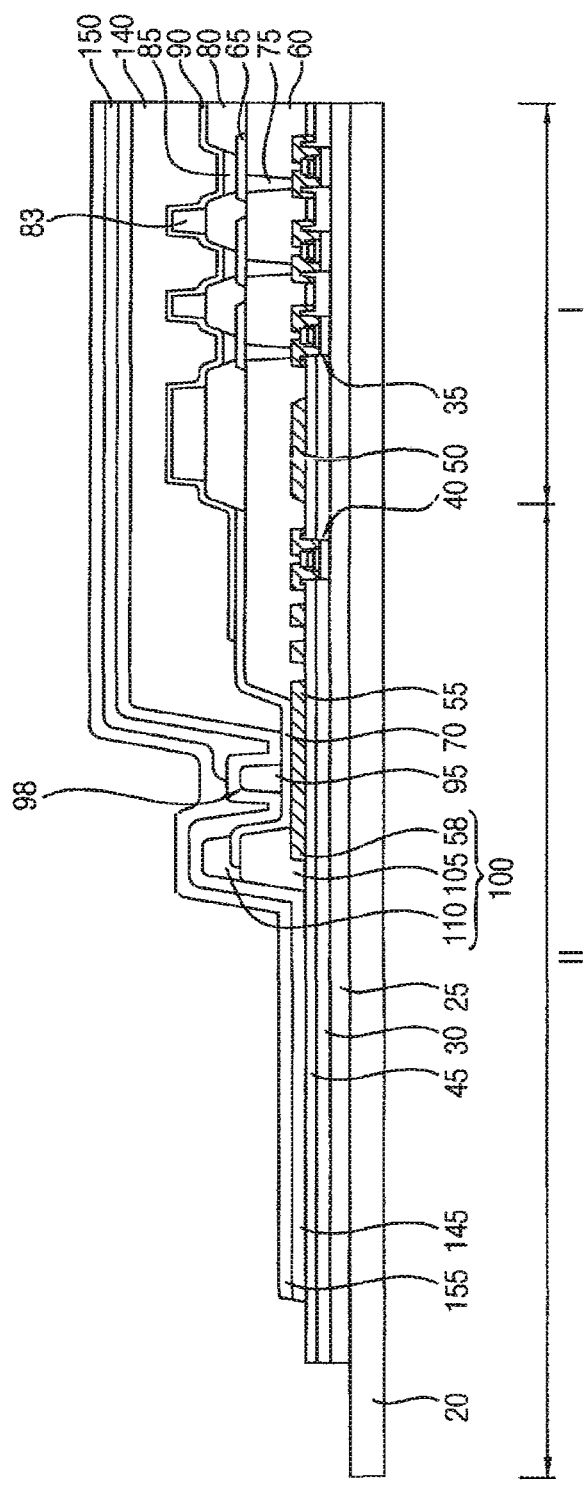
FIG. 4 is a cross-sectional view illustrating a display device in accordance with still another example embodiment.

FIG. 4 is a cross-sectional view illustrating a display device in accordance with some other example embodiments of the invention. In FIG. 4, like reference numerals are used to designate elements of the display device the same as those in FIG. 1, and detailed description of these elements may be omitted. The display device illustrated in FIG. 4 may have a configuration substantially the same as or substantially similar to that of the display device 10 described with reference to FIG. 1 except for the third blocking structure 115 illustrated in FIG. 1.

Referring to FIG. 4, the display device may include the first blocking structure 98 and the second blocking structure 100. The first blocking structure 98 may be disposed on the protection member 70, and the second blocking structure 100 may be positioned on the outermost wiring 55 partially exposed by the insulation layer 60.

In some example embodiments, the first and the second blocking structures 98 and 100 may be located adjacent to the display region I, such that the display device may have relatively reduced dimensions. Unless the display device includes too many additional organic layers, the first and the second blocking structure 98 and 100 may sufficiently prevent the leakage or overflow of the first organic layer 140 and/or the second organic layer 150 from the display region I into the peripheral region II. Further, damage (e.g., cracks) to the first inorganic layer 145 and/or the second inorganic layer 155 may not progress into the underlying structures in the display region I because of the first and the second blocking structures 98 and 100.

Figure 5:
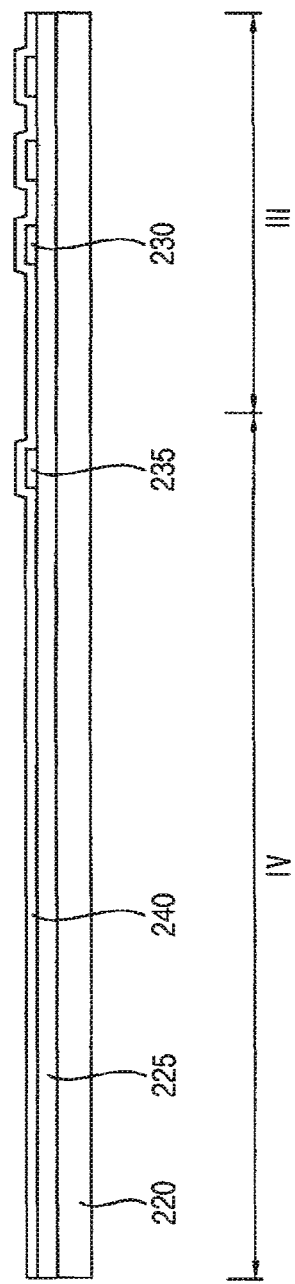
FIGS. 5 to 7 are cross-sectional views illustrating a method of manufacturing a display device in accordance with an example embodiment.
Figure 6:
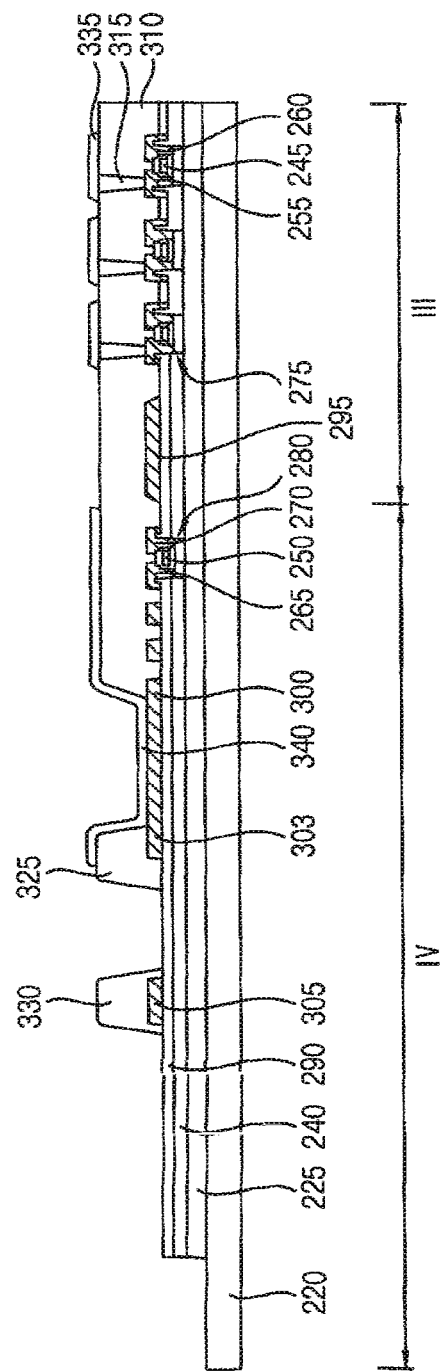
Figure 7:
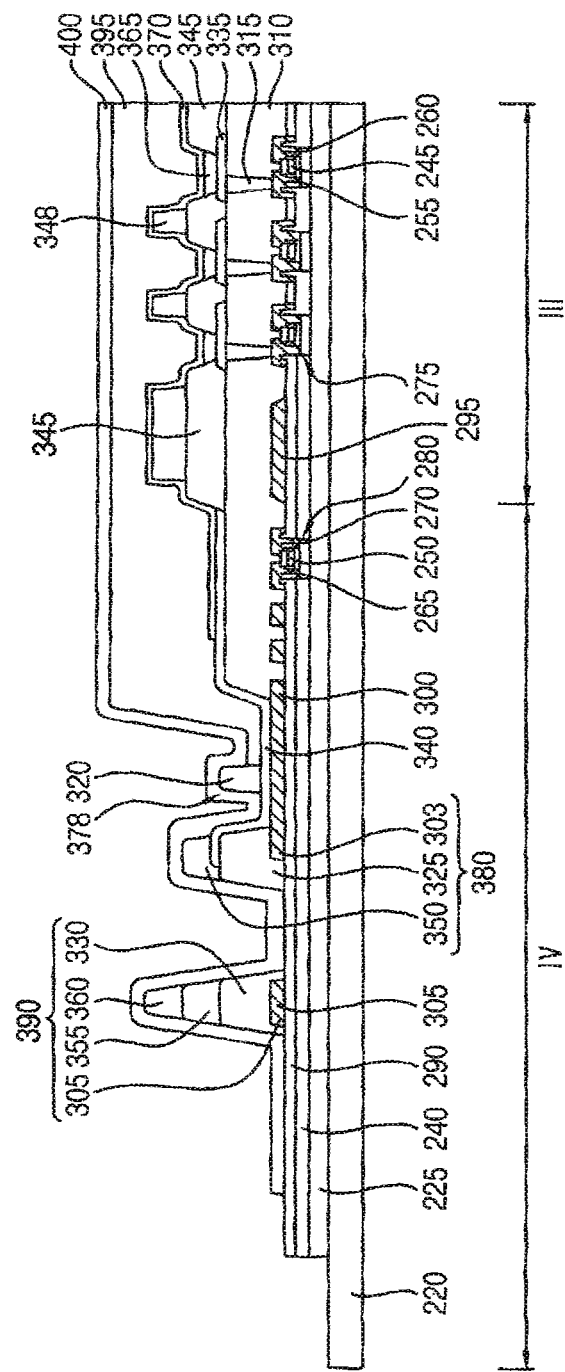

FIGS. 5 to 7 are cross-sectional views illustrating a method of manufacturing a display device in accordance with example embodiments. In FIGS. 5 to 7, the method may provide a display device having a configuration substantially the same as or substantially similar to that of the display device 10 descried with reference to FIG. 1, however, those skilled in the art could understand that any one of the display devices illustrated in FIGS. 2 to 4 may be obtained by obvious modifications or changes of the processes, such as patterning or etching processes.

Referring to FIG. 5, there is provided a substrate 220 having a display region III and a peripheral region IV. Here, the peripheral region IV of the substrate 220 may include a peripheral circuit region where peripheral circuits are formed and a dead space region corresponding to an outermost portion of the substrate 220. The substrate 220 may include a flexible transparent resin containing, for example, a poly(methyl methacrylate)-based resin (PMMA), a polyimide-based resin, an acryl-based resin, a polyacrylate-based resin, a polycarbonate-based resin, a polyether-based resin, a sulfonic acid-based resin, a polyethylene terephthalate-based resin (PET), etc. Alternatively, the substrate 220 may include a transparent ceramic substrate, for example, a glass substrate.

A buffer layer 225 may be formed on the substrate 220. The buffer layer 225 may extend from the display region III into the peripheral region IV. The buffer layer 225 may be formed utilizing a transparent resin, a silicon compound, etc. For example, the buffer layer 225 may be formed utilizing a polyacrylate-based resin, a polymethacrylate-based resin, an olefin-based resin, and/or polyvinyl-based resin, silicon oxide, silicon nitride and/or silicon oxynitride. Further, the buffer layer 225 may be formed by (e.g., obtained by) a spin coating process, a printing process, a thermal treatment process, a chemical vapor deposition process, etc.

In example embodiments, the buffer layer 225 may include a plurality of buffer films by depositing silicon compounds on the substrate 220. Alternatively, the buffer layer 225 may be formed by (e.g., obtained by) alternately forming at least one buffer film containing a silicon compound and at least one buffer film containing a transparent resin. In some example embodiments, the buffer layer 225 may not be formed on the substrate 220 based on material included in the substrate 220 or surface conditions of the substrate 220.

First active patterns 230 and second active patterns 235 may be formed on the buffer layer 225. The first active patterns 230 may be formed in (e.g., positioned in) the display region III, and the second active patterns 235 may be formed in (e.g., positioned in) the peripheral region IV. In example embodiments, a semiconductor layer may be formed on the substrate 220, and then the semiconductor layer may be patterned to form preliminary first active patterns in the display region III. In addition, preliminary second active patterns may be formed in the peripheral region IV. The first and the second active patterns 230 and 235 may be formed by (e.g., obtained by) performing a thermal treatment process, a laser irradiation process, or a thermal treatment process utilizing a catalyst on the preliminary first and second active patterns.

For example, the semiconductor layer may be formed utilizing amorphous silicon, amorphous silicon containing impurities (e.g., doped amorphous silicon), etc. Further, the semiconductor layer may be formed by a chemical vapor deposition process, a plasma enhanced chemical vapor deposition process, a low pressure chemical vapor deposition process, a sputtering process, etc. Each of the first and the second active patterns 230 and 235 may include polysilicon, polysilicon containing impurities (e.g., doped polysilicon), partially crystalized silicon, silicon containing micro crystals, a semiconductor oxide, etc.

Referring to FIG. 5, a gate insulation layer 240 may be formed on the buffer layer 225 to cover the first and the second active patterns 230 and 235. The gate insulation layer 240 may be uniformly formed on the buffer layer 225. Additionally, the gate insulation layer 240 may have an area (e.g., a surface area) substantially the same as or substantially similar to an area (e.g., a surface area) of the buffer layer 225. The gate insulation layer 240 may be formed of a silicon compound such as silicon oxide, silicon oxycarbide, silicon oxynitride, etc. Further, the gate insulation layer 240 may be formed by a chemical vapor deposition process, a spin coating process, a plasma enhanced chemical vapor deposition process, a sputtering process, a vacuum evaporation process, a high density plasma-chemical vapor deposition process, a printing process, etc. In some example embodiments, the gate insulation layer 240 may be formed by (e.g., obtained by) a chemical vapor deposition process, a spin coating process, a plasma enhanced chemical vapor deposition process, a sputtering process, a vacuum evaporation process, or a high density plasma-chemical vapor deposition process, utilizing a metal oxide, for example, hafnium oxide, aluminum oxide, zirconium oxide, titanium oxide, tantalum oxide, etc.

Referring to FIG. 6, first gate electrodes 245 and second gate electrodes 250 may be formed on the gate insulation layer 240. The first and the second gate electrodes 245 and 250 may be formed by a metal, an alloy, a conductive metal oxide, a transparent conductive material, etc. Further, the first and the second gate electrodes 245 and 250 may be formed by a sputtering process, a chemical vapor deposition process, a pulsed laser deposition process, a vacuum evaporation process, an atomic layer deposition process, etc. The first gate electrodes 245 may be positioned on portions of the gate insulation layer 240 under which the first active patterns 230 (see FIG. 5) are disposed in the display region III. The second gate electrodes 250 may be located on portions of the gate insulation layer 240 where the second active patterns 235 (see FIG. 5) are positioned in the peripheral region IV.

Gate lines may be formed on the gate insulation layer 240 in the display region III and the peripheral region IV. The gate lines may be electrically coupled to (e.g., electrically connected to) the first and the second gate electrodes 245 and 250. Further, source regions and drain regions may be formed in the first active patterns 230 (see FIG. 5) and the second active patterns 235 (see FIG. 5) by implantation of impurities utilizing the first and the second gate electrodes 245 and 250 as masks.

An insulating interlayer 290 may be formed on the gate insulation layer 240 to cover the first and the second gate electrodes 245 and 250. The insulating interlayer 290 may be formed utilizing a silicon compound, a transparent resin, etc. Additionally, the insulating interlayer 290 may be obtained by a printing process, a spin coating process, a chemical vapor deposition process, etc.

The insulating interlayer 290 may be partially etched to form contact holes that expose the source and the drain regions of the first and the second active patterns 230 and 235. First drain electrodes 255, first source electrodes 260, second drain electrodes 265, and second source electrodes 270 may be formed on the insulating interlayer 290 and/or at the contact holes. At the same time, wirings 295 and 300 may be formed on the insulating interlayer 290 in the display and peripheral regions III and IV. Such a wiring 295 (e.g., a data line) may be be electrically coupled (e.g., electrically connected) to the first and the second source electrodes 260 and 270. Further, the wiring 300 (e.g., a power line) may be electrically coupled (e.g., electrically connected) to a second electrode 370 (see FIG. 7).

In example embodiments, the insulating interlayer 290, the gate insulation layer 240 and the buffer layer 225 may be partially removed to expose a portion of the substrate 220 (e.g., portions of the gate insulation layer 240 may be removed to expose a portion of the substrate 220). For example, a portion of the substrate 220 adjacent to an edge thereof may be exposed after removing insulating interlayer 290, the gate insulation layer 240 and the buffer layer 225. Accordingly, a step may be generated between the substrate 220, the buffer layer 225, the gate insulation layer 240 and the insulating interlayer 290. In some example embodiments, the insulating interlayer 290 and the gate insulation layer 240 may be partially removed to expose a portion of the buffer layer 225 adjacent to an edge thereof. Additionally, the buffer layer 225 may be partially removed to expose the portion of the substrate 220 adjacent to the edge thereof.

In example embodiments, a conductive layer may be formed on the insulating interlayer 290 to fill the contact holes. After the conductive layer is formed, it may be patterned to obtain the first drain electrodes 255, the second drain electrodes 265, the first source electrodes 260, the second source electrodes 270, and the wirings 295 and 300. The conductive layer may be formed utilizing a metal, an alloy, a metal nitride, a conductive metal oxide, a transparent conductive material, etc. These may be used alone or in a combination thereof. Further, the conductive layer may be formed by a printing process, a sputtering process, a vacuum evaporation process, a chemical vapor deposition process, etc.

The first and the second drain electrodes 255 and 265 may contact the drain regions of the first and the second active patterns 230 and 235, and the first and the second source electrodes 260 and 270 may contact the source regions of the first and the second active patterns 230 and 235. First transistors 275 including the first drain electrodes 255 and the first source electrodes 260 and second transistors 280 including the second drain electrodes 265 and the second source electrodes 270 may be provided over the substrate 220. The first transistors 275 and the second transistors 280 may be formed in the display region III and the peripheral region IV, respectively.

As illustrated in FIG. 6, a metal layer pattern 305 may be formed adjacent to an outermost wiring 300 in the peripheral region IV while forming the wirings 295 and 300. In example embodiments, an insulation layer pattern of a blocking structure may not be directly formed on the insulating interlayer 290 or the substrate 220. However, the insulation layer pattern of the blocking structure may be easily formed on the metal layer pattern 305 and the insulating interlayer 290 when the metal layer pattern 305 is interposed between the insulating interlayer 290 and the insulation layer pattern of the blocking structure. For example, the metal layer pattern 305 may improve the structural stability of the blocking structure. As discussed below, the metal layer pattern 305 may be a third metal layer pattern of a third blocking structure 390 when the display device includes a first blocking structure 378, a second blocking structure 380, and the third blocking structure 390 (see FIG. 7). In this case, a portion of the outermost wiring 303 may be a second metal layer pattern of the second blocking structure 380, and a portion of a protection member 340 formed thereafter may be a first metal layer pattern of the first blocking structure 378.

An insulation layer 310 may be formed on the insulating interlayer 290 to cover the first transistors 275 and the data line 295 in the display region III and to cover the second transistors 280 and peripheral circuits in the peripheral region IV. The insulation layer 310 may extend to cover a portion 303 of the outermost wiring 300. The insulation layer 310 may be formed utilizing a polyimide-based resin, a photoresist, an acryl-based resin, a polyamide-based resin, etc. Further, the insulation layer 310 may be formed by a printing process, an ink jet process, a spin coating process, etc. Alternatively, the insulation layer 310 may be formed utilizing a silicon compound, a metal oxide, etc.

In example embodiments, insulation layer patterns 325 and 330 may be formed in the peripheral region IV while forming the insulation layer 310. That is, the insulation layer 310 and the insulation layer patterns 325 and 330 may be concurrently or simultaneously formed. Here, one of the insulation layer patterns 325 and 330 may be formed on the portion 303 of the outermost wiring 300, and the other of the insulation layer patterns 325 and 330 may be formed on the metal layer pattern 305. Thus, the portion 303 (e.g., one end portion) of the outermost wiring 300 may be covered with the insulation layer pattern 325 and another end portion of the outermost wiring 300 may be covered with the insulation layer 310. As described above, the insulation layer patterns 325 and 330 may be easily formed on the outermost wiring 300 and the metal layer pattern 305 when the insulation layers 325 and 330 include organic materials, respectively.

Referring now to FIG. 6, the insulation layer 310 may be partially etched to form contact holes that expose the first drain electrodes 255 of the first transistors 275 in the display region III. Contacts 315 may be formed in the contact holes, and first electrodes 335 may be formed on the contacts 315 and the insulation layer 310. At this time, the protection member 340 may be formed on the insulation layer 310 and the outermost wiring 300 in the peripheral region IV. Namely, the first electrodes 335 and the protection member 340 may be concurrently or simultaneously formed. Each of the first electrodes 335 and the protection member 340 may be formed utilizing a metal, an alloy, a metal nitride, a conductive metal oxide, a transparent conductive material, etc. Further, the first electrodes 335 and the protection member 340 may be formed by a sputtering process, a printing process, a chemical vapor deposition process, etc.

The first electrodes 335 may be electrically coupled to (e.g., electrically connected to) the first drain electrodes 255 through the contacts 315 formed in the contact holes, respectively. The protection member 340 may cover an exposed portion of the outermost wiring 300 and may extend from the insulation layer 310 to the insulation layer pattern 325 in the peripheral region IV. In example embodiments, a portion of the protection member 340 formed on the outermost wiring 300 may serve as the first metal layer pattern of the first blocking structure 378 (see FIG. 7). The protection member 340 may protect the peripheral circuits including a gate driver, a data driver, and a timing controller in addition to the second transistors 280 and the outermost wiring 300 from external impacts, static electricity, etc.

Referring to FIG. 7, a pixel defining layer 345 may be formed on the first electrodes 335 and the insulation layer 310 in the display region III. The pixel defining layer 345 may have openings that expose (e.g., partially expose) the first electrodes 335. Here, a first insulation layer pattern 320 and a third insulation layer pattern 350 may be formed on the protection member 340, and a fifth insulation layer pattern 355 and a sixth insulation layer pattern 360 may be formed on the insulation layer pattern 330. The first insulation layer pattern 320 may be positioned on the protection member 340, and the third insulation layer pattern 350 may be located on the protection member 340 and the insulation layer pattern 325. The fifth and the sixth insulation layer patterns 355 and 360 may be disposed on the insulation layer pattern 330 in that respective order (i.e., the fifth insulation layer pattern 355 may be on the insulation layer patter 330 and the sixth insulation layer pattern 360 may be on the fifth insulation layer pattern 355). In example embodiments, the sixth insulation layer pattern 360 may be formed (e.g., obtained) while forming a spacer 348 on the pixel defining layer 345. For example, the first insulation layer pattern 320, the third insulation layer pattern 350, the fifth insulation layer pattern 355, and the sixth insulation layer pattern 360 may be formed in the peripheral region IV while forming the pixel defining layer 345 and the spacer 348 utilizing a halftone mask or a halftone slit mask in the display region III. As a result, the first blocking structure 378 including the first metal layer pattern and the first insulation layer pattern 320 may be formed on the outermost wiring 300. Here, the first metal layer pattern of the first blocking structure may be a central portion of the protection member 340. Thus, the insulation layer pattern 325 may be referred to as a second insulation layer pattern, and the insulation layer pattern 330 may be referred to as a fourth insulation layer pattern. Hence, a second blocking structure 380 may be provided on the outermost wiring 300. The second blocking structure 380 may include the second metal layer pattern 303, the second insulation layer pattern 325, and the third insulation layer pattern 350. Additionally, a third blocking structure 390 may be formed adjacent to the second blocking structure 380. The third blocking structure 390 may include the third metal layer pattern 305, the fourth insulation layer pattern 330, the fifth insulation layer pattern 355, and the sixth insulation layer pattern 360.

In example embodiments, each of the pixel defining layer 345, the first insulation layer pattern 320, the third insulation layer pattern 350, the fifth insulation layer pattern 355, and the sixth insulation layer pattern 360 may be formed utilizing organic material. For example, each of the pixel defining layer 345, the first insulation layer pattern 320, the third insulation layer pattern 350, the fifth insulation layer pattern 355, and the sixth insulation layer pattern 360 may be formed utilizing a polyimide-based resin, a photoresist, a polyacryl-based resin, a polyamide-based resin, a siloxane-based resin, etc. Further, the pixel defining layer 345, the first insulation layer pattern 320, the third insulation layer pattern 350, the fifth insulation layer pattern 355, and the sixth insulation layer pattern 360 may be formed by a printing process, an ink jet process, a spin coating process, etc.

Light emitting layers 365 may be respectively formed on the first electrodes 335 exposed by the openings of the pixel defining layer 345. In forming of the light emitting layers 365, an organic light emitting layer (EML), a hole injection layer (HIL), a hole transfer layer (HTL), an electron transfer layer (ETL), and/or an electron injection layer (EIL) may be formed (e.g., successively formed) on each first electrode 335. Here, the organic light emitting layers may be formed utilizing light emitting materials for generating a red light, a green light, and/or a blue light according to the kinds of pixels in the organic light emitting display device. Alternatively, each organic light emitting layer may be obtained by stacking a plurality of light emitting materials for generating a red light, a green light, and a blue light on each first electrode 335 to thereby emit a white light.

In example embodiments, when a mask is place on the pixel defining layer 345 and the spacer 348 for forming the light emitting layers 365 in the display region III, the second blocking structure 380 and/or the third blocking structure 390 in the peripheral region IV may prevent damage to underlying structures, including display structures, caused by contact between the mask and the underlying structures. Thus, the display device may ensure improved reliability and durability.

A second electrode 370 may be formed on the light emitting layers 365, the pixel defining layer 345, and the spacer 348. The second electrode 370 may extend along a portion of the protection member 340 that contacts the pixel defining layer 345. The second electrode 370 may be formed utilizing a metal, an alloy, a metal nitride, a conductive metal oxide, a transparent conductive material, etc.

As illustrated in FIG. 7, a first organic layer 395 may be formed to cover the display structures in the display region III and the first to the third blocking structures 378, 380, and 390 in the peripheral region IV. The first organic layer 395 may be formed utilizing a polyimide-based resin, a polyacryl-based resin, a polyamide-based resin, etc. The first organic layer 395 may be formed by a printing process, an ink jet process, a spin coating process, a vacuum evaporation process, etc. In example embodiments, monomers forming an above-discussed resin may be coated on the display structures and the first to the third blocking structures 378, 380, and 390, and then a thermal treatment or a violet irradiation process may be performed to the monomers, thereby forming (e.g., obtaining) the first organic layer 395. While forming the first organic layer 395, the first blocking structure 378 may prevent the leakage or overflow of the first organic layer 395 toward an outside of the peripheral region IV through the peripheral region IV.

A first inorganic layer 400 may be formed on the first organic layer 395. The first inorganic layer 400 may be formed utilizing a metal compound by a vacuum evaporation process, a sputtering process, a chemical vapor deposition process, etc.

Although it is not illustrated, an additional organic layer and an additional inorganic layer may be alternately formed on the first inorganic layer 400, so that the display device may have a configuration substantially the same as or substantially similar to that of the display device 10 described with reference to FIG. 1. Alternatively, more than one additional organic layer and more than one additional inorganic layer may be alternately formed on the first inorganic layer 400.

Figure 8:
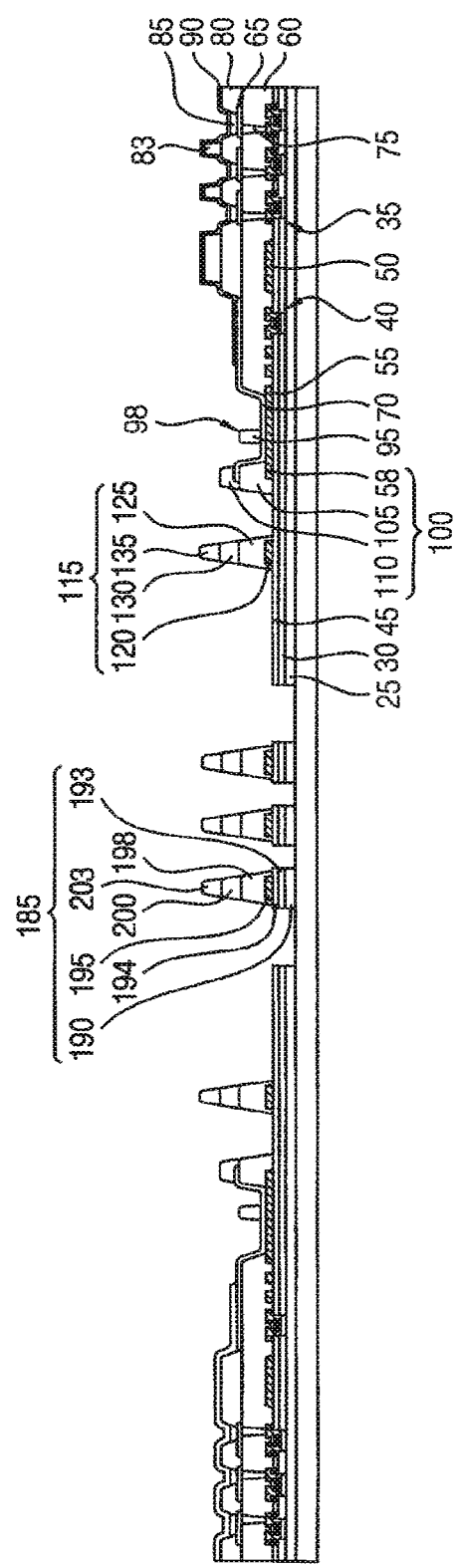
FIG. 8 is a cross-sectional view illustrating a plurality of display device in accordance with still another example embodiment.

FIG. 8 is a cross-sectional view illustrating a plurality of display devices in accordance with some other example embodiments of the invention. For example, FIG. 8 illustrates the plurality of display devices provided on a mother substrate before separation of individual display devices. In FIG. 8, like reference numerals are used to designate elements of the display device the same as those in FIG. 1, and detailed description of these elements may be omitted.

Referring to FIG. 8, the display devices may include at least one additional blocking structure 185 disposed between adjacent unit pixels of the display devices. In this case, each of the unit pixels may include the first blocking structure 98, the second blocking structure 100, and the third blocking structure 115 as described above.

In some example embodiments, the display devices may include three additional blocking structures 185. The numbers of blocking patterns in each additional blocking structure 185 may be identical, and thus the additional blocking structures 185 may have substantially the same or similar heights. For example, each of the additional blocking structures 185 may have a height substantially the same or substantially similar to the third height of the third blocking structure 115. Alternatively, the additional blocking structure 185 may have different or various heights, respectively.

As illustrated in FIG. 8, each of the additional blocking structures 185 may include a first additional insulation layer pattern 190, a second additional insulation layer pattern 193, a third additional insulation layer pattern 194, an additional metal layer pattern 195, a fourth additional insulation layer pattern 198, a fifth additional insulation layer pattern 200, and a sixth additional insulation layer pattern 203. The first to the third additional insulation layer patterns 190, 193, and 194 may include materials substantially the same as or substantially similar to those of the buffer layer 25, the gate insulation layer 30, and the insulating interlayer 45, respectively. The additional metal layer pattern 195 of each additional blocking structure 185 may include material substantially the same as or substantially similar to that of the wirings 50 and 55. Further, the fourth additional insulation layer pattern 198, the fifth additional insulation layer pattern 200, and the sixth additional insulation layer pattern 203 may include materials substantially the same as or substantially similar to those of the insulation layer 60, the pixel defining layer 80, and the spacer 83, respectively.

In some example embodiments, the display device may include the additional blocking structures 185 positioned between adjacent pixels, such that damages to the underlying structures, including the display structures, caused by forming the light emitting layers 85 utilizing a mask may be more effectively prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and aspects of the invention. Accordingly, all such modifications are intended to be included within the scope of the invention as defined in the claims and their equivalents. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. A display device comprising:
a substrate comprising a display region and a peripheral region;
a pixel defining layer having a plurality of openings;
a plurality of display structures at the display region of the substrate, each of the plurality of display structures comprising a first electrode, a light emitting layer in one of the openings in the pixel defining layer, and a second electrode;
an organic layer on the plurality of display structures;
at least one inorganic layer on the organic layer;
a metal layer at the peripheral region of the substrate;
a plurality of blocking structures on the metal layer; and
a protection member extending from a side of the pixel defining layer at the peripheral region of the substrate,
wherein a first one of the blocking structures has a height different from a height of a second one of the blocking structures,
wherein the first one of the blocking structures comprises a metal layer pattern extending from the metal layer.

2. The display device of claim 1, wherein the metal layer comprises an outermost data line.

3. The display device of claim 2, further comprising a transistor at the display region of the substrate,
wherein the metal layer comprises a material that is the same as materials of source and drain electrodes of the transistor.

4. The display device of claim 2, further comprising a transistor at the display region of the substrate, wherein the metal layer is concurrently formed with source and drain electrodes of the transistor.

5. The display device of claim 1, the protection member is electrically connected to the second electrode.

6. The display device of claim 1, wherein the at least one inorganic layer comprises a plurality of inorganic layers, and wherein the organic layer is interposed between the plurality of inorganic layers.

7. The display device of claim 6, wherein the inorganic layers contact each other at the peripheral region of the substrate.

8. The display device of claim 1, wherein the second one of the blocking structures comprises two insulation layer patterns.

9. The display device of claim 1, wherein the second one of the blocking structures comprises at least two insulation layer patterns.

10. A display device comprising:
a substrate comprising a display region and a peripheral region;
a pixel defining layer having a plurality of openings;
a plurality of display structures at the display region of the substrate, each of the plurality of display structures comprising a first electrode, a light emitting layer in one of the openings in the pixel defining layer, and a second electrode;
an organic layer on the plurality of display structures;
at least one inorganic layer on the organic layer;
a metal layer at the peripheral region of the substrate;
a plurality of blocking structures on the metal layer; and
a protection member extending from a side of the pixel defining layer at the peripheral region of the substrate,
wherein a first one of the blocking structures has a height different from a height of a second one of the blocking structures,
wherein the first one of the blocking structures comprises at least one metal layer pattern and at least two insulation layer patterns, and
wherein second one of the blocking structures comprises at least one metal layer pattern and at least three insulation layer patterns.

11. The display device of claim 10, wherein the first one of the blocking structures comprises a first metal layer pattern, a first insulation layer pattern, and a second insulation layer pattern.

12. The display device of claim 11, wherein the first metal layer pattern is a portion of the metal layer.

13. The display device of claim 11, wherein the protection member extends between the first insulation layer pattern and the second insulation layer pattern.

14. The display device of claim 11, wherein the second one of the blocking structures comprises a second metal layer pattern, a third insulation layer pattern, a fourth insulation layer pattern and a fifth insulation layer pattern.

15. The display device of claim 14, wherein the second metal layer pattern comprises a material that is the same as a material of the first metal layer pattern.

16. The display device of claim 10, wherein the at least one inorganic layer comprises a plurality of inorganic layers, and wherein the organic layer is interposed between the plurality of inorganic layers.

17. The display device of claim 16, wherein the inorganic layers contact each other at the peripheral region of the substrate.

* * * * *